United States Patent
Yamamoto

(10) Patent No.: US 7,974,323 B2
(45) Date of Patent: Jul. 5, 2011

(54) SEMICONDUCTOR LASER

(75) Inventor: Toru Yamamoto, Kanagawa (JP)

(73) Assignee: Sumitomo Electric Device Innovations, Inc., Yokohama, Kanagawa (JP)

( * ) Notice: Subject to any disclaimer, the term of this patent is extended or adjusted under 35 U.S.C. 154(b) by 68 days.

(21) Appl. No.: 12/616,944

(22) Filed: Nov. 12, 2009

(65) Prior Publication Data
US 2010/0118906 A1    May 13, 2010

(30) Foreign Application Priority Data
Nov. 12, 2008 (JP) .................. 2008-289986

(51) Int. Cl.
    *H01S 5/00*    (2006.01)
(52) U.S. Cl. .............. 372/45.011; 372/43.01; 372/45.01
(58) Field of Classification Search .............. 372/45.011
    See application file for complete search history.

(56) References Cited

U.S. PATENT DOCUMENTS
5,363,392 A    11/1994    Kasukawa et al.

FOREIGN PATENT DOCUMENTS
| JP | 5-145178 A | 6/1993 |
| JP | 7-111367 A | 4/1995 |
| JP | 11-087764 A | 3/1999 |

*Primary Examiner* — Minsun Harvey
*Assistant Examiner* — Xinning Niu
(74) *Attorney, Agent, or Firm* — Westerman, Hattori, Daniels & Adrian, LLP

(57) ABSTRACT

A semiconductor laser includes: a multiple quantum well active layer that is formed on a semiconductor substrate comprised by GaAs and includes well layers having GaInAsP that has a tensile strain against the GaAs, and a barrier layer having AlGaInP that has substantially zero strain against the GaAs, the well layers and the barrier layer being alternately stacked; a pair of first AlGaInP layers that has substantially zero strain against the GaAs, and is provided so that the first AlGaInP layers contact upper and lower surfaces of the multiple quantum well active layer respectively; and a pair of second AlGaInP layers that has a compressive strain against the GaAs, and is provided so that the second AlGaInP layers contact the pair of first AlGaInP layers respectively.

6 Claims, 3 Drawing Sheets

SEMICONDUCTOR LASER

CROSS-REFERENCE TO RELATED APPLICATION

This application is based upon and claims the benefit of priority of the prior Japanese Patent Application No. 2008-289986, filed on Nov. 12, 2008, the entire contents of which are incorporated herein by reference.

BACKGROUND (i) Technical Field

A certain aspect of the embodiments discussed herein is related to a semiconductor laser.

(ii) Related Art

An AlGaInP semiconductor laser has attracted attention as a visible light semiconductor laser which emits red light. Some AlGaInP semiconductor lasers have an active layer including a multiple quantum well (MQW) structure.

There has been developed an art to reduce a threshold current in a semiconductor laser of which the active layer has a MQW structure, by introducing a compressive strain or a tensile strain to a well layer (e.g. Japanese Laid-Open Patent Publication No. 07-111367). There has been developed another art to implement a low threshold current operation at high temperature, by introducing a tensile strain to a well layer, and a compressive strain to a barrier layer (e.g. Japanese Laid-Open Patent Publication No. 05-145178).

There is a proposal to introduce one of a compressive strain and a tensile strain to a buffer layer and/or a cap layer when introducing the other of the compressive strain or the tensile strain to an active layer, to obtain stable characteristics by compensating the overall strain of stacked semiconductor layers (e.g. Japanese Laid-Open Patent Publication No. 11-87764).

However, the spectrum half width of PL (photoluminescence) spectrum increases when a tensile strain is introduced to the well layer as described in Japanese Laid-Open Patent Publication No. 07-11367, in the case where the active layer is formed by a MQW structure having a well layer composed of GaInAsP and a barrier layer composed of AlGaInP in order to realize a semiconductor laser that has an emission wavelength between 650 and 700 nm and oscillates in a TM mode.

In addition, when a tensile strain is introduced to the well layer and a compressive strain is introduced to the barrier layer as described in Japanese Laid-Open Patent Publication No. 05-145178, the spectrum half width further increases.

It is an object of the present invention to reduce the spectrum half width.

SUMMARY

According to an aspect of the present invention, there is provided a semiconductor laser including: a multiple quantum well active layer that is formed on a semiconductor substrate comprised by GaAs and includes well layers having GaInAsP that has a tensile strain against the GaAs, and a barrier layer having AlGaInP that has substantially zero strain against the GaAs, the well layers and the barrier layer being alternately stacked; a pair of first AlGaInP layers that has substantially zero strain against the GaAs, and is provided so that the first AlGaInP layers contact upper and lower surfaces of the multiple quantum well active layer respectively; and a pair of second AlGaInP layers that has a compressive strain against the GaAs, and is provided so that the second AlGaInP layers contact the pair of first AlGaInP layers respectively.

DETAILED DESCRIPTION

A description will now be given, with reference to FIGS. 1 through 3C, of a semiconductor laser in accordance with an embodiment.

Figure 1:
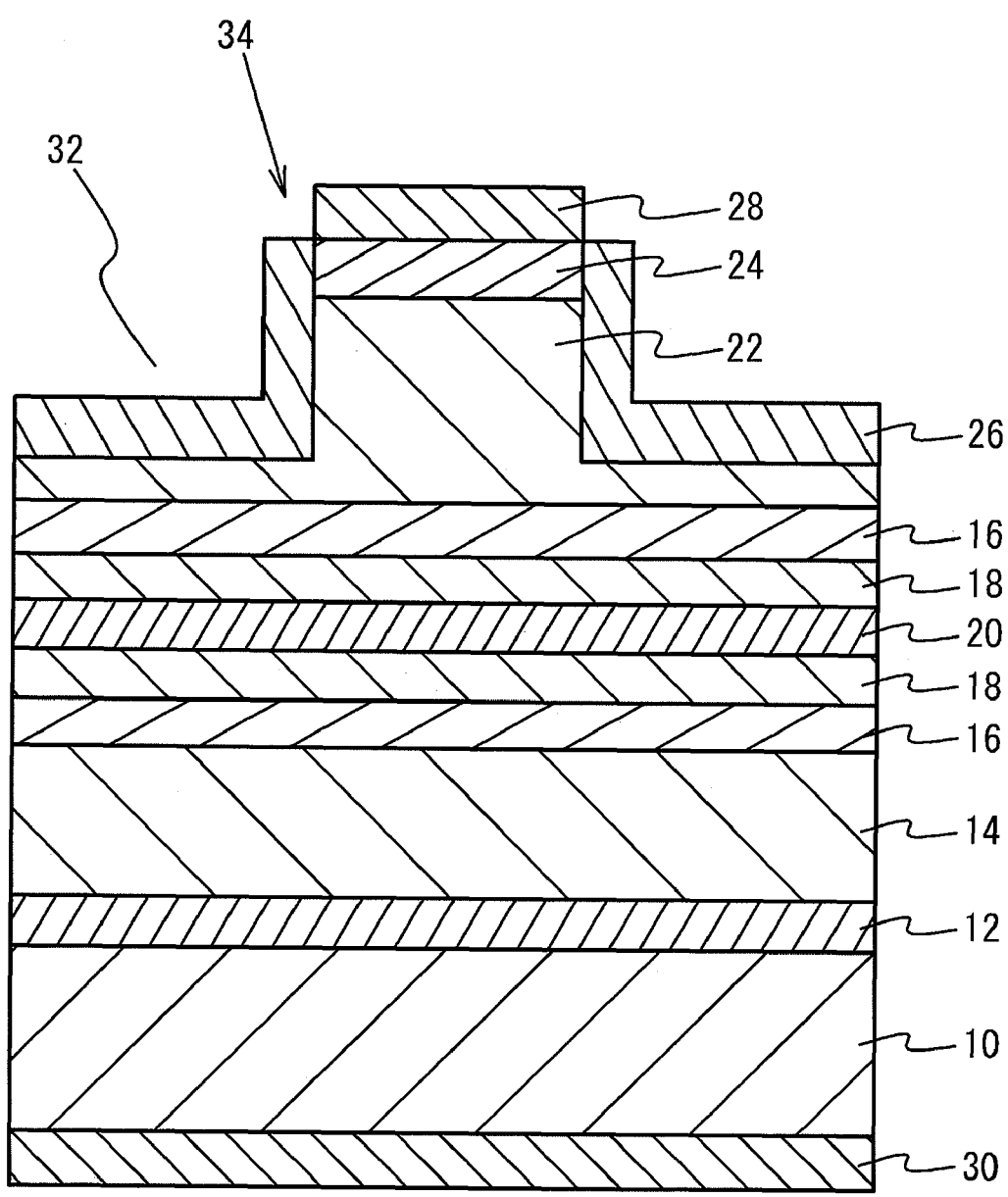
FIG. 1 is a cross section diagram of a semiconductor laser in accordance with the embodiment.

The following embodiment is a semiconductor laser that has a wavelength of 680 nm and oscillates in a TM mode. FIG. 1 is a cross section diagram of the semiconductor laser in accordance with the embodiment. In FIG. 1, an n-type GaAs buffer layer 12, an n-type clad layer 14, a second guide layer 16, a first guide layer 18, a multiple quantum well active layer 20, another first guide layer 18, another second guide layer 16, a p-type clad layer 22 and a contact layer 24 are formed in this order on an n-type GaAs substrate 10. The two first guide layers 18 are formed so as to contact upper and lower surfaces of the multiple quantum well active layer 20 and sandwich the multiple quantum well active layer 20. The two second guide layers 16 are formed so as to contact the first guide layers 18 from upper and lower directions of the multiple quantum well active layer 20 and sandwich the multiple quantum well active layer 20 and first guide layers 18.

Recess portions 32 are formed by removing parts of the contact layer 24 and the p-type clad layer 22. A ridge portion 34 is composed of the contact layer 24 and the p-type clad layer 22 and is formed between the recess portions 32. An insulating film 26 covers the ridge portion 34 and the recess portions 32, and a part of the insulating film 26 on the ridge portion 34 is removed. A p-side electrode 28 that contacts the contact layer 24 is formed on the ridge portion 34, and an n-side electrode 30 is formed on the underside of the n-type GaAs substrate 10.

Table 1 indicates compositions, film thicknesses, and strain amounts of: the n-type clad layer 14; second guide layers 16; first guide layers 18; the multiple quantum well active layer 20; and the p-type clad layer 22 stacked on the n-type GaAs substrate 10. Strain of each layer stacked on the n-type GaAs substrate 10 is strain on the n-type GaAs substrate 10, and is produced by the difference between the lattice constant of each layer and the lattice constant of the n-type GaAs substrate 10. The strain includes tensile strain and compressive strain. The tensile strain is produced when the lattice constant of each layer is smaller than the lattice constant of the n-type GaAs substrate 10. The compressive strain is produced when the lattice constant of each layer is larger than the lattice constant of the n-type GaAs substrate. A strain amount is expressed with {(the lattice constant of each layer—the lattice constant of the n-type GaAs substrate)/the lattice constant of the GaAs substrate}×100(%).

Table 1 indicates the composition, the film thickness, the strain amount of each layer from bottom to top of the table according to the order of layers stacked on the n-type GaAs substrate 10. A detail description will now be given of each layer stacked on the n-type GaAs substrate 10 with reference to Table 1.

A Si-doped 10°-off substrate of which the crystal face is inclined toward to a [111] direction from a (100) surface is used as the n-type GaAs substrate 10.

The n-type GaAs buffer layer 12 is doped with Si.

The n-type clad layer 14 is composed of Si-doped $(Al_{0.7}Ga_{0.3})_{0.526}In_{0.474}P$, and has a film thickness of 2.6 μm and zero strain. The refractive index of the n-type clad layer 14 is lower than the refractive indexes of second guide layers 16, first guide layers 18, and well layers of the multiple quantum well active layer 20 described later.

The second guide layer 16 is composed of $(Al_{0.62}Ga_{0.38})_{0.484}In_{0.516}P$, and a film thickness of 15 nm and a compressive strain of +0.3%. The refractive index of the second guide layer 16 is higher than the refractive indexes of the n-type clad layer 14 and the p-type clad layer 22, and is lower than refractive indexes of well layers of the multiple quantum well active layer 20 described later.

The First guide layer 18 is composed of $(Al_{0.5}Ga_{0.5})_{0.523}In_{0.477}P$, and its film thickness is 15 nm. A lattice match with the n-type GaAs substrate 10 is made, and the first guide layer 18 has zero strain. That is, the lattice constant of the first guide layer 18 is equivalent to the lattice constant of the n-type GaAs substrate 10. The term "zero strain" includes substantially zero strain in which the strain amount is equal to or more than −0.1% and is less than or equal to +0.1%. This means that the strain amount of the first guide layer 18 Sg1 is within a range from −0.1% to +0.1%. The refractive index of the first guide layer 18 is also higher than the refractive indexes of the n-type clad layer 14 and the p-type clad layer 22, and is lower than the refractive indexes of well layers of the multiple quantum well active layer 20 described later.

The multiple quantum well active layer 20 is composed of well layers and a barrier layer alternately stacked to each other, and its both ends are composed of well layers. Table 1 indicates that the number of well layers is two and the number of barrier layers is one, but the number of well layers may be three and the number of barrier layers may be two in a practical application. The well layers are composed of $Ga_{0.813}In_{0.187}As_{0.4}P_{0.6}$, and have a film thickness of 8 nm and a tensile strain of −0.8%. The barrier layer is composed of $(Al_{0.5}Ga_{0.5})_{0.523}In_{0.477}P$, and has a film thickness of 5 nm. The lattice match with the n-type GaAs substrate 10 is made, and the barrier layer has zero strain. The term "zero strain" includes a substantially zero strain in which the strain amount is equal to or more than −0.1% and is less than or equal to +0.1% as well as the first guide layer 18. Therefore, the strain amount of the barrier layer Sb is within a range from −0.1% to +0.1%.

The first guide layer 18 and the second guide layer 16 provided over the multiple quantum well active layer 20 have the same composition, film thickness and strain amount as the first guide layer 18 and the second guide layer 16 described above. This means that a pair of first guide layers 18 is provided so that first guide layers 18 contact with upper and lower surfaces of the multiple quantum well active layer 20 respectively, and a pair of second guide layers 16 is provided so that second guide layers 16 contact the pair of first guide layers 18 respectively from the upper and lower directions of the multiple quantum well active layer 20, as described above.

The p-type clad layer 22 is composed of Mg-doped $(Al_{0.7}Ga_{0.3})_{0.526}In_{0.474}P$, and has a film thickness of 1.8 μm and the zero strain. The refractive index of the p-type clad layer 22 is lower than the refractive indexes of the second guide layers 16, first guide layers 18, and well layers of the multiple quantum well active layer 20.

The contact layer 24 is composed of Zn-doped GaAs.

TABLE 1

| | COMPOSITION | FILM THICKNESS | STRAIN AMOUNT |
|---|---|---|---|
| p-TYPE CLAD LAYER | Mg-DOPED $(Al_{0.7}Ga_{0.3})_{0.526}In_{0.474}P$ | 1.8 μm | ZERO STRAIN |
| SECOND GUIDE LAYER | $(Al_{0.62}Ga_{0.38})_{0.484}In_{0.516}P$ | 15 nm | +0.3% |
| FIRST GUIDE LAYER | $(Al_{0.5}Ga_{0.5})_{0.523}In_{0.477}P$ | 15 nm | ZERO STRAIN |
| WELL LAYER | $Ga_{0.813}In_{0.187}As_{0.40}P_{0.60}$ | 8 nm | −0.8% |
| BARRIER LAYER | $(Al_{0.5}Ga_{0.5})_{0.523}In_{0.477}P$ | 5 nm | ZERO STRAIN |
| WELL LAYER | $Ga_{0.813}In_{0.187}As_{0.40}P_{0.60}$ | 8 nm | −0.8% |
| FIRST GUIDE LAYER | $(Al_{0.5}Ga_{0.5})_{0.523}In_{0.477}P$ | 15 nm | ZERO STRAIN |
| SECOND GUIDE LAYER | $(Al_{0.62}Ga_{0.38})_{0.484}In_{0.516}P$ | 15 nm | +0.3% |
| n-TYPE CLAD LAYER | Si-DOPED $(Al_{0.7}Ga_{0.3})_{0.526}In_{0.474}P$ | 2.6 μm | ZERO STRAIN |

Figure 2A:
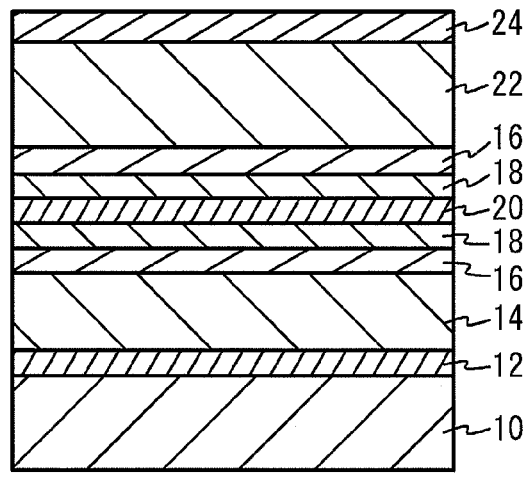
FIGS. 2A through 2C are cross section diagrams illustrating a fabrication method of the semiconductor laser in accordance with the embodiment.

A description will now be given of a fabrication method of the semiconductor laser in accordance with the embodiment, with reference to FIGS. 2A through 2C. In FIG. 2A, the n-type GaAs buffer layer 12, the n-type clad layer 14, the second guide layer 16, the first guide layer 18, the multiple quantum well active layer 20, the first guide layer 18, the second guide layer 16, the p-type clad layer 22, and the contact layer 24 are deposited in this order on the n-type GaAs substrate 10 by the reduced pressure MOCVD (Metal Organic Chemical Vapor Deposition) method.

The growth temperature in the MOCVD growth is 700° C., and the growth pressure is $1.0 \times 10^4$ Pa. Materials used in the MOCVD growth will now be described. Trimethylaluminium (TMA), trimethylgallium (TMG), and trimethylindium (TMI) are used as group-III materials. Arsine ($AsH_3$) and phosphine ($PH_3$) are used as group-V materials. Disilane ($Si_2H_6$) is used as an additive material of the n-type layer such as the n-type GaAs buffer layer 12 and the n-type clad layer 14. Bis(cyclopentadienyl)magnesium ($Cp_2Mg$) is used as an additive material of the p-type layer such as the p-type clad layer 22. Diethylzinc (DEZ) is used as an additive material of the p-type layer such as the contact layer 24.

Figure 2B:
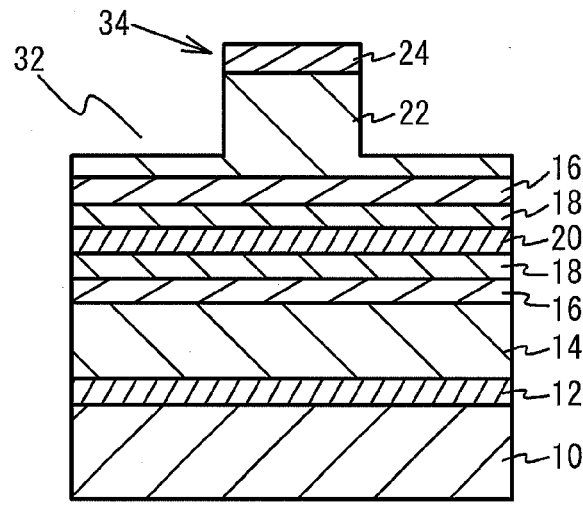

In FIG. 2B, a mask layer is deposited on the contact layer 24. By a photolithography process and an etching process, the mask layer in the area where recess portions 32 should be formed is removed. The contact layer 24 and the p-type clad layer 22 are etched by using the mask layer as a mask, and the recess portions 32 that reach the middle of the p-type clad layer 22 are formed. Then, the ridge portion 34 is formed between the recess portions 32.

Figure 2C:
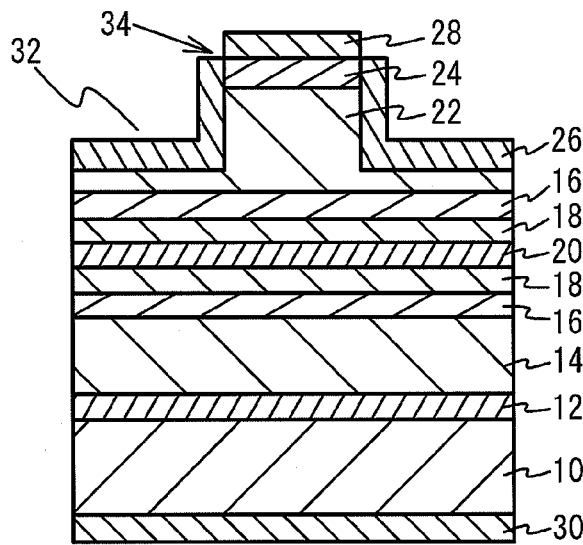

In FIG. 2C, the insulating film 26 composed of an SiN film is formed so as to cover the ridge portion 34 and the recess portions 32 by depositing the SiN film on the whole surface for example. By the photolithography process and the etching process, the insulation layer 26 on the ridge portion 34 on which the p-type electrode 28 should be formed is removed. Then, by a vacuum deposition method, the p-type electrode 28 is formed on the ridge portion 34. The n-type electrode 30 is formed on the underside of the n-type GaAs substrate 10 by the vacuum deposition method.

Figure 3A:
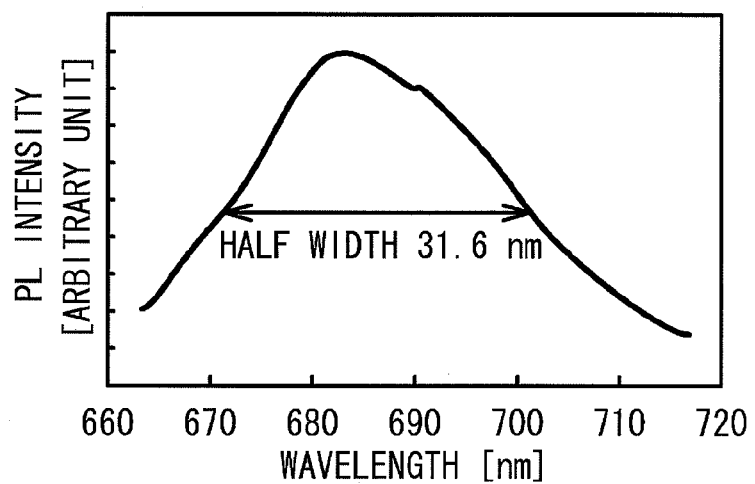
FIG. 3A is a measurement result of PL spectrum of the semiconductor laser in accordance with the embodiment.
Figure 3B:
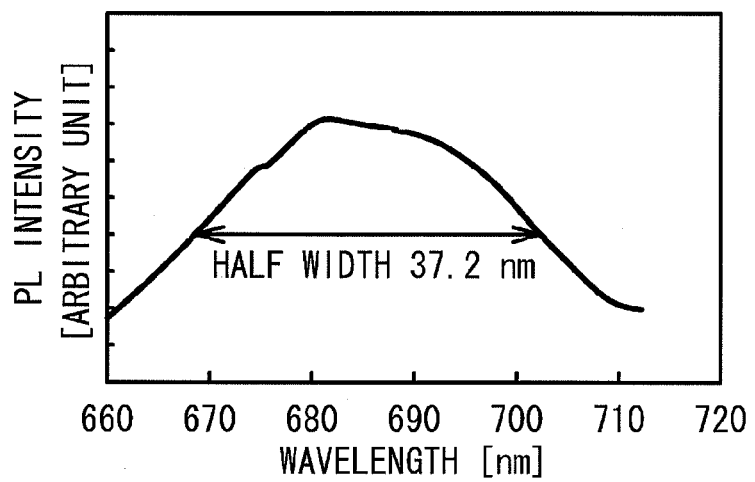
FIGS. 3B and 3C are measurement results of PL spectra of semiconductor lasers in accordance with the first comparative example and the second comparative example.
Figure 3C:
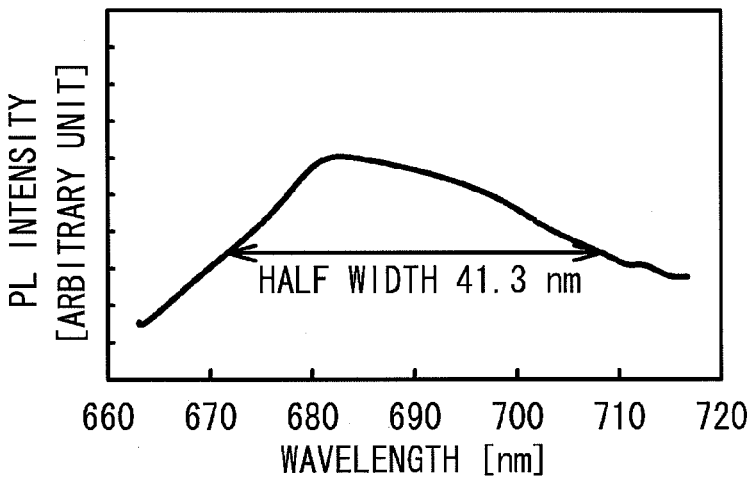

FIG. 3A indicates a measurement result of PL spectrum of the semiconductor laser in accordance with the embodiment. FIG. 3B and FIG. 3C indicate measurement results of PL spectra of a first comparative example and a second comparative example for comparison. The first comparative example is a case that a tensile strain is introduced to only the well layers of the multiple quantum well active layer. The second comparative example is a case that a tensile strain is introduced to the well layers and a compressive strain is introduced to the barrier layer and guide layers contacting the well layers.

Structures of semiconductor lasers in accordance with the first comparative example and the second comparative example are the same as the structure of the semiconductor laser in accordance with the embodiment illustrated in FIG. 1. The composition, film thickness, and strain amount of the guide layer and/or the multiple quantum well active layer stacked on the n-type GaAs substrate 10 are different between the embodiment, and the first comparative example and the second comparative example. The compositions, film thicknesses, and strain amounts of the guide layer and the multiple quantum well active layer stacked on the n-type GaAs substrate 10 will now be described with respect to the semiconductor lasers of the first comparative example and the second comparative example, with reference to Table 2 and Table 3. Tables 2 and 3 indicate the composition, the film thickness, and the strain amount of each layer from bottom to top of the table according to the order of layers stacked on the n-type GaAs substrate 10.

In Table 2, the multiple quantum well active layer of the semiconductor laser in accordance with the first comparative example is composed of well layers and guide layers of which compositions, film thicknesses, and strain amounts are same as ones of the multiple quantum well active layer 20 of the semiconductor laser in accordance with the embodiment. The number of layers that form the well layers and barrier layers is same as that of the embodiment. The guide layer that contacts the upper and lower surfaces of the multiple quantum well active layer, is composed of $(Al_{0.5}Ga_{0.5})_{0.523}In_{0.477}P$, and has the zero strain, and has a film thickness of 30 nm. Others are same as those of the semiconductor laser in accordance with the embodiment.

TABLE 2

| COMPOSITION | FILM THICKNESS | STRAIN AMOUNT |
|---|---|---|
| GUIDE LAYER | $(Al_{0.5}Ga_{0.5})_{0.523}In_{0.477}P$ | 30 nm | ZERO STRAIN |
| WELL LAYER | $Ga_{0.813}In_{0.187}As_{0.40}P_{0.60}$ | 8 nm | −0.8% |
| BARRIER LAYER | $(Al_{0.5}Ga_{0.5})_{0.523}In_{0.477}P$ | 5 nm | ZERO STRAIN |
| WELL LAYER | $Ga_{0.813}In_{0.187}As_{0.40}P_{0.60}$ | 8 nm | −0.8% |
| GUIDE LAYER | $(Al_{0.5}Ga_{0.5})_{0.523}In_{0.477}P$ | 30 nm | ZERO STRAIN |

In Table 3, the multiple quantum well active layer of the semiconductor laser in accordance with the second comparative example differs from the embodiment in that the composition of the barrier layer is $(Al_{0.62}Ga_{0.38})_{0.484}In_{0.516}P$ and its strain amount is a compressive strain of +0.3%. However, others are same as those of the multiple quantum well active layer 20 of the embodiment. In other words, in the second comparative example, the well layers have a tensile strain of −0.8%, and the barrier layer has a compressive strain of +0.3%. The number of layers that form the well layers and the burrier layer is same as the number in the embodiment. Third guide layers that contact the upper and lower surfaces of the multiple quantum well active layer, are composed of $(Al_{0.62}Ga_{0.38})_{0.484}In_{0.516}P$, and have a compressive strain of +0.3% and a film thickness of 15 nm. Fourth guide layers that are composed of $(Al_{0.5}Ga_{0.5})_{0.523}In_{0.477}P$ and have the zero strain and a film thickness of 15 nm are formed over and under the third guide layers. Others are same as those of the semiconductor laser in accordance with the embodiment.

TABLE 3

| | COMPOSITIONS | FILM THICKNESS | STRAIN AMOUNT |
|---|---|---|---|
| FOURTH GUIDE LAYER | $(Al_{0.5}Ga_{0.5})_{0.523}In_{0.477}P$ | 15 nm | ZERO STRAIN |
| THIRD GUIDE LAYER | $(Al_{0.62}Ga_{0.38})_{0.484}In_{0.516}P$ | 15 nm | +0.3% |
| WELL LAYER | $Ga_{0.813}In_{0.187}As_{0.40}P_{0.60}$ | 8 nm | −0.8% |
| BARRIER LAYER | $(Al_{0.62}Ga_{0.38})_{0.484}In_{0.516}P$ | 5 nm | +0.3% |
| WELL LAYER | $Ga_{0.813}In_{0.187}As_{0.40}P_{0.60}$ | 8 nm | −0.8% |
| THIRD GUIDE LAYER | $(Al_{0.62}Ga_{0.38})_{0.484}In_{0.516}P$ | 15 nm | +0.3% |
| FOURTH GUIDE LAYER | $(Al_{0.5}Ga_{0.5})_{0.523}In_{0.477}P$ | 15 nm | ZERO STRAIN |

A description will now be given of measurement results of PL spectra of the semiconductor lasers in accordance with the embodiment, the first comparative example, and the second comparative example, with reference to FIGS. 3A through 3C. The center wavelengths of semiconductor lasers in accordance with the embodiment, the first comparative embodiment, and the second comparative embodiment are approximately 680 nm respectively. However, the spectrum half width is 37.2 nm in the first comparative example, 41.3 nm in the second comparative example, and 31.6 nm in the embodiment. That is, the spectrum half width of the embodiment is narrower than those of the first and second comparative examples.

In the case where the barrier layer and third guide layers that have a compressive strain are formed so as to contact the well layers having a tensile strain, it is conceived that the well layers do not grow well because of strain energy, and this causes a distortion of the boundary surface between the well layer and the barrier layer due to a variation in the thickness of the well layers, and an inhomogeneous composition of the well layers. It is thus conceivable that the spectrum half width increases in the second comparative example. As described in the first comparative example, the problem of the second comparative example tends to be improved by making the guide layers that contact the well layers have the zero strain. Accordingly it is conceived that the first comparative example can narrow the half width compared to the second comparative example. In contrast, it is conceived that in the embodiment, by making the barrier layer and first guide layers that contact the well layers having a tensile strain have the zero strain, and making the second guide layers that do not contact the well layers have a compressive strain, the above-described problem of the second comparative example does not occur, and the spectrum half width is narrowed because the overall strain of stacked semiconductor layers can be inhibited.

The embodiment is not limited to the above-described case where the strain amount of the tensile strain Sw that the GaInAsP well layer has is −0.8%, but includes another case where the strain amount Sw is within a range from −1.5% to −0.1%. When the strain amount Sw of the GaInAsP layer is from −0.1% to 0%, it is not possible to say that the GaInAsP layer has a tensile strain. It is not preferable that the strain amount Sw of the GaInAsP layer is less than −1.5% because it becomes close to indirect transition region. More preferred range of the strain amount Sw is from −0.8% to −0.5%. The embodiment is not limited to case that the strain amount of the compressive strain Sg2 that the second guide layer 16 of AlGaInP has is +0.3%, but includes another case where the strain amount Sg2 is within a range from +0.1% to +3.8%. When the strain amount Sg2 of the AlGaInP layer is between 0% and +0.1%, it is not possible to say that the AlGaInP layer has a compressive strain. It is not preferable that the strain amount Sg2 is more than +3.8% because the strain can not act as a compressive strain. More preferred range of the strain amount Sg2 is from +0.2% to +0.3%.

It is preferable that the relation between the strain amount of the barrier layer Sb and the strain amount of the well layer Sw is "$0.05\% \leq (Sb-Sw)$". This is because the difference between the strain of the barrier layer and the strain of the well layer may not be identified when the value of (Sb−Sw) is smaller than 0.05%. In the same reason, it is preferable that the relation between the strain amount of the first guide layer 18 Sg1 and the strain amount of the well layer Sw is "$0.05\% \leq (Sg1-Sw)$", and the relation between the strain amount of the second guide layer 16 Sg2 and the strain amount of the first guide layer 18 Sg1 is "$0.05\% \leq (Sg2-Sg1)$".

The embodiment is not limited to the composition of the well layer of $Ga_{0.813}In_{0.187}As_{0.4}P_{0.6}$. When the composition of the well layer is expressed with $Ga_XIn_{(1-X)}As_YP_{(1-Y)}$, an arbitrary (X, Y) value within a range surrounded by lines connecting four points (X=0.529, Y=0), (X=0.717, Y=0), (X=1, Y=0.583) and (X=1, Y=0.972) can be used.

The embodiment is not limited to the composition of the second guide layer 16 of $(Al_{0.62}Ga_{0.38})_{0.484}In_{0.516}$. When the composition of the second guide layer 16 is expressed with $(Al_XGa_{(1-X)})_YIn_{(1-Y)}P$, an arbitrary (X,Y) value within a range surrounded by lines connecting three points (X=0, Y=0.502), (X=1, Y=0.516), and (X=0, Y=0) can be used.

The present invention is not limited to the specifically described embodiments and variations but other embodiments and variations may be made without departing from the scope of the claimed invention.

What is claimed is:

1. A semiconductor laser comprising:
   a multiple quantum well active layer that is formed on a semiconductor substrate comprised by GaAs and includes well layers having GaInAsP that has a tensile strain against the GaAs, and a barrier layer having AlGaInP that has substantially zero strain against the GaAs, the well layers and the barrier layer being alternately stacked;
   a pair of first AlGaInP layers that has substantially zero strain against the GaAs, and is provided so that the first AlGaInP layers contact upper and lower surfaces of the multiple quantum well active layer respectively; and
   a pair of second AlGaInP layers that has a compressive strain against the GaAs, and is provided so that the second AlGaInP layers contact the pair of first AlGaInP layers respectively.

2. The semiconductor laser according to claim 1, wherein:
   a strain amount of the barrier layer Sb, a strain amount of the first AlGaInP layers Sg1, a strain amount of the well layers Sw, and a strain amount of the second AlGaInP layers Sg2 are within ranges from −0.1% to +0.1%, from −0.1% to +0.1%, from −1.5% to −0.1%, and from +0.1% to +3.8% on the semiconductor substrate respectively; and
   relations between the strain amount of the barrier layer Sb and the strain amount of the well layers Sw, between the strain amount of the first AlGaInP layers Sg1 and the strain amount of the well layers Sw, and between the strain amount of the second AlGaInP layers Sg2 and the strain amount of the first AlGaInP layers Sg1 are $0.05\% \leq (Sb-Sw)$, $0.05\% \leq (Sg1-Sw)$, and $0.05\% \leq (Sg2-Sg1)$, respectively.

3. The semiconductor laser according to claim 1, wherein:
   in an expression of a composition of the well layers with $Ga_XIn_{1-X}As_YP_{1-Y}$, the composition of the well layers is defined by an arbitrary point within a range surrounded by lines connecting four points (X=0.529, Y=0), (X=0.717, Y=0), (X=1, Y=0.583) and (X=1, Y=0.972) on a graph of which orthogonal axes are Ga composition X and As composition Y; and
   in an expression of a composition of the second AlGaInP layers with $(Al_XGa_{1-X})_YIn_{1-Y}P$, the composition of the second AlGaInP layers is defined by an arbitrary point within a range surrounded by lines connecting three points (X=0, Y=0.502), (X=1, Y=0.516), and (X=0, Y=0) on a graph of which orthogonal axes are Al composition X and AlGa composition Y.

4. The semiconductor laser according to claim 1, wherein refractive indexes of the first AlGaInP layers are lower than refractive indexes of the well layers.

5. The semiconductor laser according to claim 4, wherein refractive indexes of the second AlGaInP layers are lower than the refractive indexes of the well layers.

6. The semiconductor laser according to claim 1, wherein an oscillation mode of the semiconductor laser is a TM mode.

* * * * *